United States Patent [19]

Schädeli et al.

[11] Patent Number: 5,397,680
[45] Date of Patent: Mar. 14, 1995

[54] POSITIVE PHOTORESIST HAVING IMPROVED PROCESSING PROPERTIES

[75] Inventors: Ulrich Schädeli, Plasselb, Switzerland; Norbert Münzel, Heitersheim, Germany

[73] Assignees: Ciba-Geigy AG, Basel, Switzerland; QCG Microelectronics, West Paterson, N.J.

[21] Appl. No.: 249,972

[22] Filed: May 27, 1994

Related U.S. Application Data

[62] Division of Ser. No. 160,818, Dec. 3, 1993.

[30] Foreign Application Priority Data

Dec. 4, 1992 [CH] Switzerland .................. 3723/92

[51] Int. Cl.[6] .................................................. G03C 1/73
[52] U.S. Cl. ........................................ 430/270; 522/31
[58] Field of Search ............................ 430/270; 522/31

[56] References Cited

U.S. PATENT DOCUMENTS

| | | | |
|---|---|---|---|
| 3,423,367 | 1/1969 | Clark et al. | 526/262 |
| 4,491,628 | 1/1985 | Ito et al. | 430/176 |
| 4,604,438 | 8/1986 | Beuhler et al. | 526/262 |
| 4,629,773 | 12/1986 | Muller | 526/262 |
| 5,069,987 | 12/1991 | Schwalm et al. | 430/270 |
| 5,118,585 | 6/1992 | Schwalm et al. | 430/326 |

FOREIGN PATENT DOCUMENTS

| | | |
|---|---|---|
| 342498 | 11/1989 | European Pat. Off. . |
| 410794 | 1/1991 | European Pat. Off. . |
| 0568496 | 11/1993 | European Pat. Off. . |
| 61-218607 | 9/1986 | Japan . |

OTHER PUBLICATIONS

Funhoff et al., SPIE, vol. 1672 (Adv. Resist Technol. Process.) pp. 46–55 (1992).
Macromolecules, 1989, 22, 21–25 "Photocopolymerization of electron-rich olefins with electron-poor Olefins . . .".
"Synthesis and polymerization of N-tert-butyloxycabony)maleimide". . . Kwang et al., Feb. 28, 1992.
Chemical Abstracts, vol. 115, 1991 115:170717z "Negative Chemical amplification resist systems based on polyhydroxystyrenes and N-substituted im ides or aldehydes".

*Primary Examiner*—Joseph L. Schofer
*Assistant Examiner*—N. Sarofim
*Attorney, Agent, or Firm*—Wenderoth, Lind & Ponack

[57] ABSTRACT

Polymers having a molecular weight (weight average) $M_w$ from $10^3$ to $10^6$, comprising recurring structural units of the formulae (I), (IIa) and (IIb)

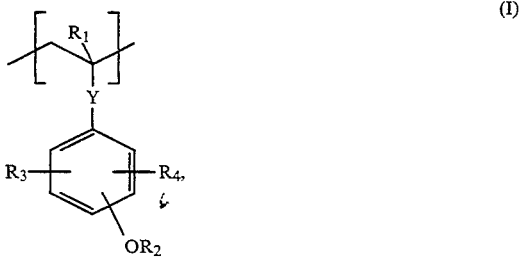

(I)

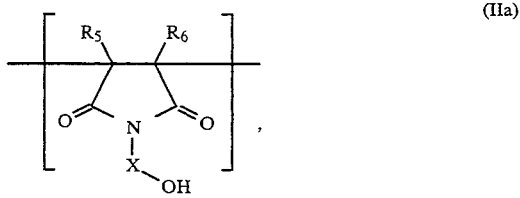

(IIa)

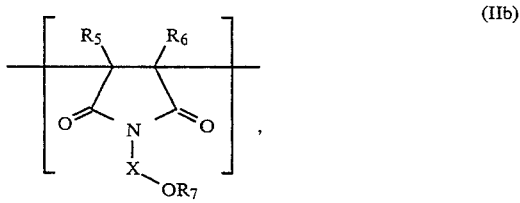

(IIb)

in which $R_1$ is hydrogen or methyl, Y is a direct bond or a divalent radical of the formula (III)

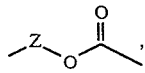 (III)

in which Z is a $C_1$–$C_6$alkylene group bound to the phenyl nucleus, $OR_2$ is an acid-cleavable radical, in which $R_2$ is $C_4$–$C_{10}$tert-alkyl, allyl, cyclohex-2-enyl, $C_6$–$C_{14}$aryl or $C_7$–$C_{16}$aralkyl which are unsubstituted or mono- or poly-substituted by $C_1$–$C_6$alkyl groups, $C_1$–$C_6$alkoxy groups or halogen atoms, trialkylsilyl or a group of the formulae (IV)–(VII)

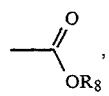 (IV)

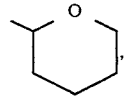 (V)

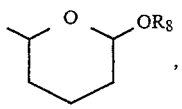 (VI)

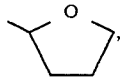 (VII)

in which $R_8$ is $C_1$–$C_6$alkyl, or $C_6$–$C_{14}$aryl or $C_7$–$C_{16}$aralkyl which are unsubstituted or mono- or poly-substituted by $C_1$–$C_6$alkyl groups, $C_1$–$C_6$alkoxy groups or halogen atoms, $R_3$ and $R_4$ independently of one another are hydrogen, $C_1$–$C_6$alkyl groups, $C_1$–$C_6$alkoxy groups or halogen atoms, $R_5$ and $R_6$ independently of one another are hydrogen or methyl, X is $C_1$–$C_6$alkylene and $R_7$ is $C_1$–$C_6$alkyl, or $C_6$–$C_{14}$aryl or $C_7$–$C_{16}$aralkyl which are unsubstituted or mono- or poly-substituted by $C_1$–$C_6$alkyl groups, $C_1$–$C_6$alkoxy groups or halogen atoms, or is —CO—$R_8$ in which $R_8$ is as defined in formula (IV), are suitable for use in DUV positive photoresists which show greatly reduced delay time effects and are distinguished by a high thermal stability and high resolution capacity.

7 Claims, No Drawings

POSITIVE PHOTORESIST HAVING IMPROVED PROCESSING PROPERTIES

This application is a division of application Ser. No. 08/160,818, filed Dec. 3, 1993.

The present invention relates to polymers based on derivatives of styrene and maleimide, to radiation-sensitive compositions containing these polymers, to the use of such compositions as positive photoresist and to the protective layers and relief structures produced from these compositions.

Lithography in the deep UV region (DUV, wavelengths of about 200–300 nm) is particularly suitable for producing relief structures in the submicron range.

In EP-A 410 794, negative DUV photoresists are described which comprise specific acid-hardenable copolymers and terpolymers based on styrene and hydroxymaleimides. These negative resists can be developed under aqueous-alkaline conditions.

In general, however, positive photoresists are more suitable for producing images of certain geometrical structures, for example isolated lines, equidistant lines or interspacious or contact holes, and they are usually preferred for such applications over comparable negative resists.

Positive photoresist compositions based on poly[p-tert-butoxycarbonyloxystyrene] and onium salts, suitable for lithography in the UV region, are known, for example, from U.S. Pat. 4 491 628.

Similar resist formulations comprising poly[p-2-tetrahydropyranyloxy]styrene are described in EP-A 342 498.

However, these chemically intensified positive photoresists show, as a function of the so-called delay time, structural changes which manifest themselves in more or less pronounced T-shaped profiles (T-topping) of the developed structures. Delay time signifies the time difference between exposure and the subsequent post-exposure bake which is as a rule necessary in order to ensure complete reaction of the acid-sensitive groups with the acid generated by the exposure.

Traces of organic bases in the surrounding atmosphere are probably responsible for these delay time effects. In "Deep-UV Resists with improved delay capacities", SPIE Volume 1672 (Adv. Resist Technol. Process.), 46–55 (1992), D. J. H. Funhoff, H. Binder and R. Schwalm discuss various measures for suppressing this undesired effect, for example the application of an additional protective coating, an expensive filtration of the air, or the use of special developers for removing the T-tops, and finally recommend the use of specific additives. The stability, achieved in this way, towards delay time effects involves, however, a certain loss of sensitivity.

It has now been found that, when specific polymers based on derivatives of styrene and maleimide are used as photoresist materials, the delay time effects described above are largely suppressed without addition of additives or the insertion of additional process steps.

The present invention relates to polymers having a molecular weight (weight average) $M_w$ from $10^3$ to $10^6$, comprising recurring structural units of the formulae (I), (IIa) and (IIb)

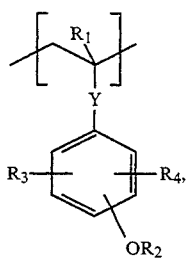

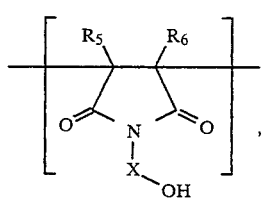

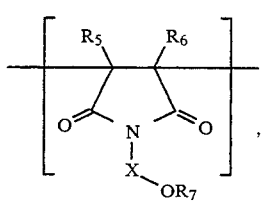

in which $R_1$ is hydrogen or methyl, Y is a direct bond or a divalent radical of the formula (III)

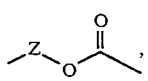

in which Z is a $C_1$–$C_6$alkylene group bound to the phenyl nucleus, $OR_2$ is an acid-cleavable radical, in which $R_2$ is $C_4$–$C_{10}$tert-alkyl, allyl, cyclohex-2-enyl, $C_6$–$C_{14}$aryl or $C_7$–$C_{16}$aralkyl which are unsubstituted or mono- or poly-substituted by $C_1$–$C_6$alkyl groups, $C_1$–$C_6$alkoxy groups or halogen atoms, trialkylsilyl or a group of the formulae (IV)–(VII)

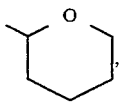

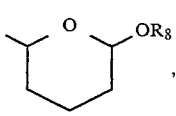

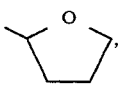

in which $R_8$ is $C_1$–$C_6$alkyl, or $C_6$–$C_{14}$aryl or $C_7$–$C_6$aralkyl which are unsubstituted or mono- or poly-substituted by $C_1$–$C_6$alkyl groups, $C_1$–$C_6$alkoxy groups or halogen atoms, $R_3$ and $R_4$ independently of one another are hydrogen, $C_1$–$C_6$alkyl groups, $C_1$–$C_6$alkoxy groups or halogen atoms, $R_5$ and $R_6$ independently of one another are hydrogen or methyl, X is $C_1$–$C_6$alkylene and $R_7$ is $C_1$–$C_6$alkyl, or $C_6$–$C_{14}$aryl or $C_7$–$C_{16}$aralkyl which are unsubstituted or mono- or poly-substituted by $C_1$–$C_6$alkyl groups, $C_1$–$C_6$alkoxy groups or halogen atoms, or is —CO—$R_8$ in which $R_8$ is as defined in formula (IV).

$R_1$ is preferably hydrogen.

Y is preferably a direct bond.

Alkyl or alkoxy groups $R_2$, $R_3$, $R_4$, $R_7$ or $R_8$, or alkyl or alkoxy groups as substituents of allyl, cyclohex-2-enyl, aryl or aralkyl groups can be straight-chain or branched. Examples are: methyl, ethyl, n-propyl, i-propyl, n-butyl, sec-butyl, tert-butyl, n-pentyl, neopentyl, n-hexyl, methoxy, ethoxy, n-propoxy, i-propoxy, n-butoxy, sec-butoxy, tert-butoxy, n-pentoxy, neopentoxy and n-hexoxy.

Halogen atoms as radicals $R_3$ or $R_4$, or as substituents of allyl, cyclohex-2-enyl, aryl or aralkyl groups, are preferably bromine or chlorine atoms.

Unsubstituted or substituted aryl or aralkyl groups $R_2$, $R_7$ or $R_8$ are, for example, phenyl, tolyl, xylyl, mesityl, isityl, naphthyl, anthryl, phenanthryl, fluorenyl, biphenyl, benzyl, 2-phenylethyl, 2-phenylprop-2-yl or tolylmethyl.

Unsubstituted or substituted allyl groups $R_2$ are preferably allyl, methallyl or especially 3-methylbut-2-enyl.

$C_1$–$C_6$Alkylene groups Y or X can likewise be straight-chain or branched. Examples are methylene, ethylene, propylene, 2,2-propanediyl, trimethylene, tetramethylene and hexamethylene.

Preferred polymers according to the invention comprise recurring structural units of the formula (I) in which $R_1$, $R_3$ and $R_4$ are hydrogen, Y is a direct bond and $R_2$ is $C_4$–$C_{10}$tert-alkyl, trimethylsilyl, allyl which is unsubstituted or mono- or poly-substituted by $C_1$–$C_6$alkyl groups, cyclohex-2-enyl or a group of the formulae (IV)–(VII) in which $R_8$ is $C_1$–$C_4$alkyl or phenyl.

Particularly preferred are polymers comprising recurring structural units of the formula (I) in which $R_1$, $R_3$ and $R_4$ are hydrogen, Y is a direct bond and $R_2$ is tert-butyl, tert-butoxycarbonyl, 3-methylbut-2-enyl or a group of the formula (V).

In the structural units of the formula (IIa), $R_5$ and $R_6$ are preferably hydrogen and X is preferably methylene.

Also preferred are polymers comprising recurring structural units of the formula (IIb) in which $R_5$ and $R_6$ are hydrogen, $R_7$ is $C_1$–$C_4$alkyl, phenyl or —CO—$R_8$, in which $R_8$ is $C_1$–$C_4$alkyl or phenyl, and X is methylene, ethylene, trimethylene or tetramethylene.

Particularly preferred are polymers comprising recurring structural units of the formula (IIb) in which $R_5$ and $R_6$ are hydrogen, $R_7$ is methyl or acetyl and X is methylene or ethylene.

The polymers according to the invention preferably comprise 10–75 mol %, in particular 20–50 mol %, of structural units of the formula (IIa) and 25–90 mol %, in particular 50–80 mol %, of structural units of the formula (IIb), relative to 100 mol % structural units of the formula (I).

The molecular weight (weight average) of these polymers is preferably 5000–500 000, in particular 20 000–250 000.

The polymers according to the invention can be prepared in a known manner by free-radical polymerization of compounds of the formulae (IX), (Xa) and (Xb)

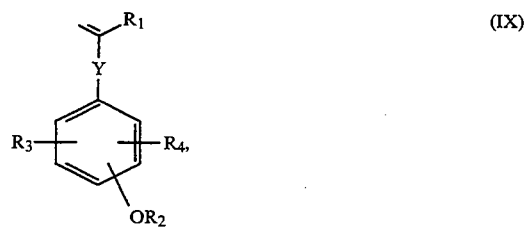

in which $R_1$ to $R_8$, Y and X are as defined above.

The free-radical copolymerization can be carded out with application of various techniques. These have been described, for example, by S. Sandler and W. Karo in "Polymer Synthesis", Volume 1, pages 3–17, 1968, Academic Press, New York. Examples of usual polymerization processes are the polymerization in bulk or in solvents, and also emulsion polymerization, suspension polymerization or precipitation polymerization. If desired, the molecular weight can be adjusted by the addition of small quantities of a regulator (for example dodecylmercaptan).

The starting products of the formulae (IX), (Xa) and (Xb) are known or can be prepared by known methods.

The compounds of the formula (IX), in which Y is a direct bond and $R_2$ is $C_1$–$C_6$alkyl, $C_1$–$C_6$alkoxy, $C_6$–$C_{14}$aryl, $C_7$–$C_{15}$aralkyl, trimethylsilyl or $C_2$–$C_8$alkenyl, can be obtained, for example, by condensation of unsubstituted or substituted p-hydroxystyrene or α-methyl-p-hydroxystyrene with the corresponding alkyl, alkoxy, aryl, aralkyl, trimethylsilyl or alkenyl halides or tosylates in the presence of bases.

Analogously, compounds of the formula (IX), in which Y is a direct bond and $R_2$ is a group of the formula (IV), are accessible from unsubstituted or substituted p-hydroxystyrene or α-methyl-p-hydroxystyrene and the corresponding chlorocarbonates.

The compounds of the formula (IX), in which Y is a direct bond and $R_2$ is a group of the formulae (V)–(VII), can be synthesized, for example, from unsubstituted or substituted p-hydroxystyrene or α-methyl-p-hydroxystyrene by reaction with 2,3-dihydropyran, 5-alkoxy-, 5-aryloxy- or 5-aralkoxy-2,3-dihydropyran or 2,3-dihydrofuran in acid solution.

The compounds of the formula (IX), in which Y is a divalent radical of the formula (III), can be prepared analogously from the corresponding acrylates or methacrylates.

Examples of suitable compounds of the formula (IX) are 4-methoxystyrene, α-methyl-4-methoxystyrene, 4-ethoxystyrene, 4-tert-butoxystyrene, 4-phenoxystyrene, 4-benzyloxystyrene, 4-trimethylsilyloxystyrene, 4-allyloxystyrene, 4-methallyloxystyrene, 4-(tert-butylcarbonyloxy)styrene, 4-(2-tetrahydropyranyloxy)styrene, 4-(2-tetrahydrofuranyloxy)styrene, 4-(3-methylbut-2-enyloxy)styrene, 4-(2-tetrahydropyranyloxy)benzyl methacrylate and 4-(2-tetrahydropyranyloxy)benzyl acrylate.

The compounds of the formulae (Xa) and (Xb) are likewise known or can be prepared by known processes from maleimide or methyl- or dimethyl-maleimide, for example by reacting maleimide in the presence of bases with a halide or a tosylate of the formula LG—X—OH or LG—X—OR$_7$, in which X and R$_7$ are as defined above and LG is halogen or $CH_3$—$C_6H_4$—$SO_3$.

The synthesis of N-hydroxymethylmaleimide from maleimide and formaldehyde in the presence of NaOH is described, for example, in EP-A 410 794.

Examples of suitable compounds of the formulae (Xa) and (Xb) are N-hydroxymethylmaleimide, N-2-hydroxyethylmaleimide, N-3-hydroxypropylmaleimide, N-4-hydroxybutylmaleimide, N-(2-hydroxyprop-2-yl)maleimide, N-methoxymethylmaleimide, N-phenoxymethylmaleimide, N-benzyloxymethylmaleimide, N-2-methoxyethylmaleimide, N-3-methoxypropylmaleimide, N-4-methoxybutylmaleimide, N-acetoxymethylmaleimide and N-(2-acetoxyethyl)maleimide.

The polymerization is in general initiated by a conventional free radical starter. These include thermal initiators such as azo compounds, for example α,α'-azoisobutyronitrile (AIBN), or peroxides, for example benzoyl peroxide, or redox initiator systems such as a mixture of iron(III) acetylacetonate, benzoin and benzoyl peroxide, or photochemical free-radical formers such as benzoin or benzil dimethylketal.

The polymerization is preferably carded out in solution. The reaction temperature is in general in the range from 10° to 200° C., preferably between 40° and 150° C., particularly preferably between 40° and 100° C.

Solvents which may be present must be inert under the reaction conditions. Possible solvents are, inter alia, aromatic hydrocarbons, chlorinated hydrocarbons, ketones and ethers. Examples are: benzene, toluene, xylenes, ethylbenzene, isopropylbenzene, ethylene chloride, propylene chloride, methylene chloride, chloroform, methyl ethyl ketones, acetone, cyclohexanone, diethyl ether or tetrahydrofuran.

As mentioned at the outset, the polymers according to the invention are very suitable as base resins for DUV positive photoresists, which show greatly reduced delay time effects and have a high resolution capacity and high thermal stability.

The invention thus also relates to radiation-sensitive compositions comprising
a) at least one polymer according to the invention as defined above and
b) at least one compound which forms an acid under the action of actinic radiation.

Preferably, the compositions according to the invention comprise as further component c) a solvent or a solvent mixture.

Moreover, the compositions according to the invention can comprise solution inhibitors, which reduce the solubility of the composition in conventional alkaline developers, but which are cleaved under the action of acid in such a way that the remaining reaction products are soluble in the developer. Such solution inhibitors are known to those skilled in the art and are described, for example, in EP-A 329 610 and EP-A 475 903.

The compounds b), which form an acid under the action of actinic radiation, can especially be onium salts, such as diazonium salts, sulfonium salts, sulfoxonium salts and iodonium salts, and also disulfones. Preferred are sulfonium salts of the formula VIII

$(Ar_1)_q(Z_1)(Z_2)_sS^{\oplus}X^{\ominus}$ (VIII), in which
Ar$_1$ is phenyl, naphthyl or phenyl-$COCH_2$—, which are unsubstituted or substituted by halogen, $C_1$-$C_4$alkyl, $C_1$-$C_4$alkoxy, —OH and/or nitro,
Z$_1$ is $C_1$-$C_6$alkyl or $C_3$-$C_7$cycloalkyl and
Z$_2$ is tetrahydrothienyl, tetrahydrofuryl or hexahydropyryl,
q is 0, 1, 2 or 3,
r is 0, 1 or 2 and
s is 0 or 1, the sum q+r+s being 3, and
X$_1^{\ominus}$ is a chloride, bromide or iodide anion, $BF_4^{\ominus}$, $PF_6^{\ominus}$, $AsF_6^{\ominus}$, $SbF_6^{\ominus}$, $FSO^{\ominus}$ or the anion of an organic sulfonic acid or carboxylic acid.

Phenyl, naphthyl and phenacyl groups Ar$_1$ are preferably monosubstituted, in particular by Cl, Br, methyl, methoxy, —OH or nitro. Particularly preferably, these radicals are unsubstituted. Z$_1$ is preferably $C_1$-$C_4$alkyl, especially methyl or ethyl. Preferably, q is 2 or 3, r is 1 or zero and s is zero, and especially q is 3, and r and s are zero. Very particularly preferably, Ar$_1$ is unsubstituted phenyl and q is 3.

The anion X$_1^{\ominus}$ of an organic sulfonic acid or carboxylic acid can be the anion or aliphatic, cycloaliphatic, carbocyclic-aromatic, heterocyclic-aromatic or araliphatic sulfonic or carboxylic acids. These anions can be substituted or unsubstituted. Sulfonic and carboxylic acids of low nucleophily are preferred, for example partially fluorinated or perfluorinated derivatives or derivatives which are substituted in the position vicinal to the particular acid group. Examples of substituents are halogen such as chlorine or especially fluorine, alkyl such as methyl, ethyl or n-propyl, or alkoxy such as methoxy, ethoxy or n-propoxy.

Examples of aliphatic sulfonic acids are methane-, ethane-, n-propane-, n-butane- and n-hexane-sulfonic acid or the corresponding partially fluorinated or perfluorinated derivatives.

Examples of aliphatic carboxylic acids are formic acid, acetic acid, propionic acid, butyric acid, pivalic acid, caproic acid, 2-ethylhexylcarboxylic acid and fatty acids such as lauric acid, myristic acid or stearic acid, and also the partially fluorinated or perfluorinated derivatives of these acids.

Examples of cycloaliphatic sulfonic or carboxylic acids are cyclohexanesulfonic acid, cyclohexanecarboxylic acid, camphor-10-sulfonic acid or partially fluorinated or perfluorinated derivatives thereof.

Examples of carbocyclic-aromatic sulfonic acids are benzenesulfonic acid, toluenesulfonic acid, ethylbenzenesulfonic acid, isopropylbenzenesulfonic acid, dodecylbenzenesulfonic acid or dimethylbenzenesulfonic acid, 2,4,6-triisopropylbenzenesulfonic acid, 2,4,6- trimethylbenzenesulfonic acid, naphthalene-mono-, -di- or -tri-sulfonic acids and the corresponding alkylated or partially fluorinated or perfluorinated derivatives of these sulfonic acids.

Examples of heterocyclic-aromatic sulfonic acids are pyridine-, thiophene- or pyrrole-sulfonic acids and the corresponding partially fluorinated or perfluorinated derivatives of these acids.

Examples of araliphatic sulfonic acids are benzylsulfonic acid, α-methylbenzylsulfonic acid and the corresponding partially fluorinated or perfluorinated derivatives of these compounds.

Examples of carbocyclic aromatic carboxylic acids are benzoic acid, toluenecarboxylic acid, ethylbenzenecarboxylic acid, isopropylbenzenecarboxylic acid or dimethylbenzenecarboxylic acid, naphthalenecarboxylic acid or anthracenecarboxylic acid and the corresponding partially fluorinated or perfluorinated derivatives of these compounds.

Examples of heterocyclic-aromatic carboxylic acids are pyridine-, thiophene- or pyrrolecarboxylic acid and the corresponding partially fluorinated or perfluorinated derivatives of these compounds.

Examples of araliphatic carboxylic acids are benzylcarboxylic acid, α-methylbenzylcarboxylic acid and cinnamic acid as well as the corresponding partially fluorinated or perfluorinated derivatives of these compounds.

Preferably, $X_1^\ominus$ is the monovalent anion of an organic sulfonic acid, in particular of a partially fluorinated or perfluorosulfonic acid. These anions are distinguished by a particularly low nucleophily.

Specific examples of suitable sulfonium salts of the formula VIII are triphenylsulfonium bromide, triphenylsulfonium chloride, triphenylsulfonium iodide, triphenylsulfonium hexafluorophosphate, triphenylsulfonium hexafluoroantimonate, triphenylsulfonium hexafluoroarsenate, triphenylsulfonium trifluoromethanesulfonate, diphenylethylsulfonium chloride, phenacyldimethylsulfonium chloride, phenacyltetrahydrothiophenium chloride, 4-nitrophenacyltetrahydrothiophenium chloride and 4-hydroxy-2-methylphenylhexahydrothiopyrylium chloride. Triphenylsulfonium trifluoromethanesulfonate is particularly preferred.

The compounds b) used can also be iodonium salts of the formula (XI)

$$[Ar_2I^\oplus - Ar_3]X_2^\ominus \quad (XI)$$

in which

Ar$_2$ and Ar$_3$ independently of one another are phenyl or naphthyl which are unsubstituted or substituted by $C_1$-$C_4$alkyl, $C_1$-$C_4$alkoxy, halogen and/or nitro, or Ar$_2$ and Ar$_3$ together are a group of the formula (XII)

(XII)

in which $Z_3$ is $C_1$-$C_4$alkyl, $C_1$-$C_4$alkoxy, halogen or nitro and

Q is a direct bond, —O—, —CH$_2$— or —CO— and $X_2^\ominus$ is as defined for $X_1^\ominus$ in the formula (VIII). [Iodonium salts of the formula (XI) are described, for example, in GB-A 1 539 192.

Suitable compounds b) are also substances of the formulae (XIII) to (XXII), which generate sulfonic acid under the action of actinic radiation,

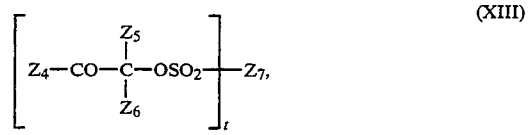

(XIII)

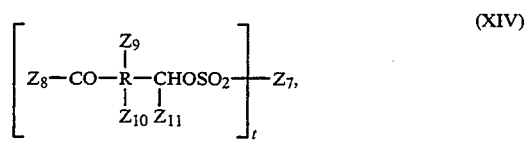

(XIV)

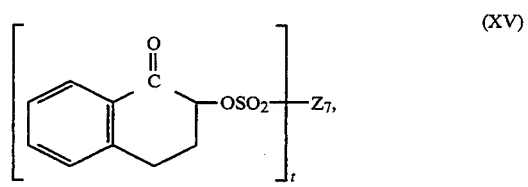

(XV)

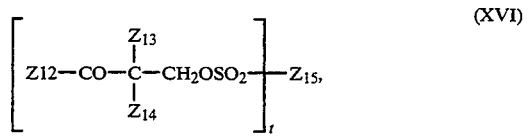

(XVI)

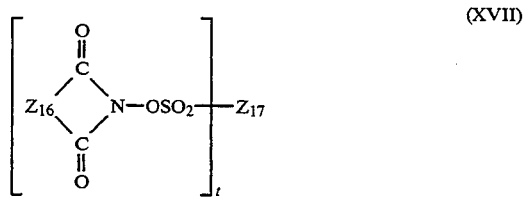

(XVII)

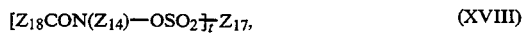

(XVIII)

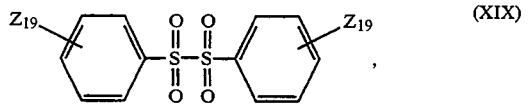

(XIX)

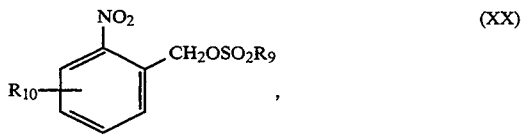

(XX)

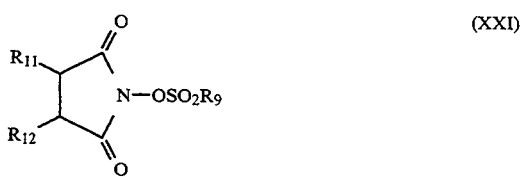

(XXI)

and

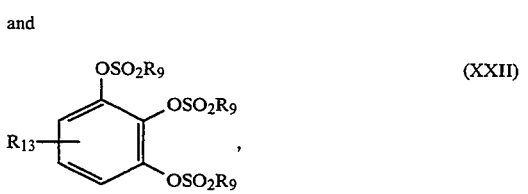

(XXII)

in which t is 1 or 2, preferably 1, $Z_4$ is phenyl or naphthyl which are mono- to tri-substituted by —Cl, —Br, —CN, —NO$_2$, C$_1$-C$_4$alkyl, C$_1$-C$_4$alkoxy, C$_1$-C$_4$alkylthio, phenoxy, phenylthio, C$_1$-C$_4$alkylamino, C$_2$-C$_4$dialkylamino or benzoyl, in particular phenyl which is unsubstituted or monosubstituted by —Cl, methyl or methoxy, $Z_5$ is hydrogen or C$_1$-C$_4$alkyl and $Z_6$ is hydrogen, C$_1$-C$_4$alkyl or phenyl or $Z_5$ and $Z_6$ form, together with the linking C atom, a cyclopentane ring or cyclohexane ring, $Z_7$, with t=1, is C$_1$-C$_{18}$alkyl, phenyl or napthhyl, which are unsubstituted or substituted by C$_1$-C$_4$alkyl, cyclopentyl, cyclohexyl or camphoryl and with t=2 is C$_2$14 C$_8$alkylene or phenylene, $Z_8$ is phenyl or naphthyl which are unsubstituted or mono- to tri-substituted by —Cl, —Br, C$_1$-C$_4$alkyl, C$_1$-C$_4$alkoxy, C$_1$-C$_4$alkylthio, phenyl, phenoxy, phenylthio, C$_1$-C$_4$alkyl-CONH—, benzoylamino or dimethylamino, in particular phenyl which is unsubstituted or monosubstituted by —Cl, C$_1$-C$_4$alkoxy, methylthio or phenyl, $Z_9$ is —OH or C$_1$-C$_4$alkyl, $Z_{10}$ is C$_1$-C$_4$alkyl or phenyl, $Z_{11}$ is hydrogen, C$_1$-C$_4$alkyl, furyl or —CCl$_3$ or $Z_{10}$ and $Z_{11}$, together with the linking C atom, form a cyclopentane ring or cyclohexane ring, $Z_{12}$ and $Z_{13}$ independently of one another are phenyl which is unsubstituted or substituted by halogen, C$_1$-C$_4$alkyl or C$_1$-C$_4$alkoxy, $Z_{14}$ is hydrogen or C$_1$-C$_4$alkyl, $Z_{15}$, with t=1, is C$_1$-C$_6$alkyl, phenyl, naphthyl or benzyl and, with t=2, is C$_1$-C$_6$alkylene, phenylene or xylylene, $Z_{16}$ is phenylene or naphthalene, which are unsubstituted or substituted by halogen, nitro, C$_1$-C$_4$alkyl, C$_1$-C$_4$alkoxy or C$_1$-C$_4$alkylthio or —CH=CH—, $Z_{17}$, with t=1, is C$_1$-C$_{12}$alkyl, which is unsubstituted or substituted by halogen, nitro, C$_1$-C$_4$alkyl or C$_1$-C$_4$alkoxy or phenyl which is unsubstituted or substituted by halogen, nitro, C$_1$-C$_4$alkyl or C$_1$-C$_4$alkoxy, and, with t=2, is C$_2$-C$_8$alkylene or phenylene, $Z_{18}$ is phenyl or naphthyl which are unsubstituted or substituted by halogen, nitro, —CN, C$_1$-C$_4$alkyl, methoxy, ethoxy, dimethylamino or benzoyl, and the $Z_{19}$ independently of one another are C$_1$-C$_4$alkyl, $R_9$ is C$_1$-C$_{12}$alkyl which is unsubstituted or substituted by halogen, nitro, C$_1$-C$_4$alkyl or C$_1$-C$_4$alkoxy, or phenyl which is unsubstituted or substituted by halogen, nitro, C$_1$-C$_4$alkyl or C$_1$-C$_4$alkoxy, $R_{10}$ is C$_1$-C$_4$alkyl, C$_1$-C$_4$alkoxy or phenyl, $R_{11}$ and $R_{12}$ independently of one another are C$_1$-C$_4$alkyl, C$_1$-C$_4$alkoxy or phenyl or together are a radical of the formulae (XXIII), (XXIV) or (XXV)

 (XXIII)

 (XXIV)

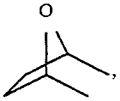 (XXV)

and $R_{13}$ is C$_1$-C$_4$alkyl, C$_1$-C$_4$alkoxy, phenyl or benzoyl. Alkyl, alkoxy, alkylthio, alkylamino, dialkylamino, alkylcarbamoyl and alkylene groups according to the definition can be straight-chain or branched, but are preferably straight-chain. Halogen is in particular —Cl or —Br.

Compounds of the formulae (XIII) to (XXII) are described, for example, in EP-A 0 166 682 and 0 085 024 and in the literature cited therein. Particularly preferred compounds of the formulae (XIII) to (XXII) are phenacyl p-methylbenzenesulfonate, benzoin p-toluenesulfonate, α-(p-toluenesulfonyloxy)methylbenzoin-3-(p-toluenesulfonyloxy)-2-hydroxy-2-phenyl-1-phenylpropylether, N-(p-dodecylbenzene-sulfonyloxy)-1,8-naphthalimide and N-(phenylsulfonyloxy)-1,8-naphthalimide.

Further suitable compounds b) are o-nitrobenzaldehydes which rearrange under actinic radiation into o-nitrosobenzoic acids, such as 1-nitrobenzaldehyde and 2,6-dinitrobenzaldehyde; α-halogenoacylphenones such as α, α, α-trichloroacetophenone and p-tert-butyl-α,α,α-trichloroacetophenone, and also sulfonic acid esters of o-hydroxyacylphenones such as 2-hydroxybenzophenone methanesulfonate and 2,4-hydroxybenzophenone bis(methanesulfonate).

Finally, suitable compounds b) are also those which comprise aromatically bound chlorine or bromine, such as are described, for example, in EP-A0 318 649, for example compounds of the formula (XXVI)

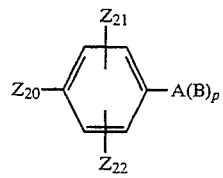 (XXVI)

with at least one aromatically bound chlorine or bromine atom, in which, for example, p is 0 or 1, $Z_{20}$ is —COOH, —OZ$_{23}$ or —SZ$_{23}$, $Z_{21}$ and $Z_{22}$ independently of one another are hydrogen, —Cl, —Br, alkyl which is unsubstituted or substituted by aryl, alkoxy, aryloxy, —OH or —F, or aryl which is unsubstituted or substituted by alkoxy, aryloxy, —OH or halogen, $Z_{23}$ is hydrogen, alkyl or aryl which are unsubstituted or substituted analogously to $Z_{21}$, or acyl, A, with p=0, is hydrogen, —Cl, —Br or alkyl which is unsubstituted or substituted analogously to $Z_{21}$, and, with p=1, is —SO$_2$—, propylene or perfluoroalkylene and B is a group

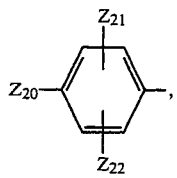

alkylcarbonyl, alkoxycarbonyl or substituted sulfonylimidocarbonyl.

Examples of such compounds are hexafluorotetrabromobisphenol A, 1,1,1-tris-(3,5-dibromo-4-hydroxyphenyl)ethane and N-(2,4,6-tribromophenyl)-N'-(p-toluenesulfonyl)urea.

Compounds b) which are used with particular preference are those of the formula (VIII), in which $Ar_1$ is phenyl, q is the number 3, r and s are zero, and $X_1^\ominus$ is $SbF_6^\ominus$, $AsF_6^\ominus$, $PF_6^\ominus$, $CF_3SO_3^\ominus$, $C_2F_5SO_3^\ominus$, n—$C_3F_7SO_3^\ominus$, n—$C_4F_9SO_3^\ominus$, n—$C_6F_{13}SO_3^\ominus$, n—$C_8F_{17}SO_3^\ominus$ or $C_6F_5SO_3^\ominus$.

Very particularly preferably, the component b) used is triphenylsulfonium trifluoromethanesulfonate.

The compounds b) are advantageously employed in a quantity of 0.1–20% by weight, preferably 1–10% by weight and especially 1–6% by weight, relative to the weight of component a).

The compositions according to the invention can comprise further conventional additives, for example binders, stabilizers, pigments, dyes, fillers, adhesion promoters, flow agents, wetting agents and plasticizers. Preferably, the compositions are dissolved in suitable solvents [component c)] for application.

The binder is selected according to the field of application and the properties demanded for this purpose. Examples of suitable binders are novolaks which are derived from an aldehyde, preferably formaldehyde, acetaldehyde or furfuraldehyde, but in particular from formaldehyde, and a phenol. The phenolic component of these binders is preferably phenol itself, or also halogenated phenol, for example substituted by one to two chlorine atoms, preferably p-chlorophenol, or it is a phenol substituted by one to two $C_1$-$C_9$alkyl groups, for example o-, m- or p-cresol, a xylenol, p-tert-butylphenol or p-nonylphenol. However, the phenol component of the preferred novolaks can also be p-phenylphenol, resorcinol, bis(4-hydroxyphenyl)methane or 2,2-bis(4-hydroxyphenyl)propane.

Examples of further suitable binders are copolymers of maleic anhydride with styrene, vinyl ethers or 1-alkenes. Homopolymeric or copolymeric acrylates and methacrylates, for example copolymers of methyl methacrylate/ethyl acrylate/methacrylic acid, poly(alkyl methacrylates) or poly(alkyl acrylates) having, for example, 1–20 carbon atoms in the alkyl radical, can also be used as binders.

Preferably, the binder used is an alkali-soluble substance, for example a novolak (if appropriate, modified as described above), poly(4-hydroxystyrene) or poly(4-hydroxy-3,5-dimethylstyrene), copolymers of maleic anhydride with styrene, vinyl ethers or 1-alkenes, and also copolymers of acrylate or methacrylate esters with ethylenically unsaturated acids, for example methacrylic acid or acrylic acid.

The radiation-sensitive compositions according to the invention, dissolved in a solvent or solvent mixture, are outstandingly suitable as coating agents for substrates of any type, for example wood, textiles, paper, ceramics, glass, plastics such as polyester, polyethylene terephthalate, polyolefins or cellulose acetate, in particular in the form of films, and also metals such as Al, Cu, Ni, Fe, Zn, Mg or Co, and GaAs, Si or $SiO_2$ to which an image is to be applied by imagewise exposure.

The selection of the solvent and the concentration depend mainly on the type of the composition and on the coating process. The solvent should be inert, i.e. it should not enter any chemical reaction with the components and it should be removable again during drying after coating. Examples of suitable solvents are ketones, ethers and esters, such as methyl ethyl ketone, 2-heptanone, cyclopentanone, cyclohexanone, γ-butyrolactone, ethyl pyruvate, diethylene glycol dimethyl ether, 2-methoxyethanol, 2-ethoxyethanol, 2-ethoxyethyl acetate, 1-methoxy-2-propyl acetate, 1,2-dimethoxyethane, ethyl acetate and 3-methoxymethyl propionate.

The solution is applied by means of known coating processes uniformly to a substrate, for example by spincoating, dipping, blade coating, curtain coating methods, brushing, spraying, especially by electrostatic spraying, and reverse roller coating. It is also possible to apply the photosensitive layer to a temporary flexible support and then to coat the final substrate, for example a copper-laminated circuit board, by layer transfer via lamination.

The quantity applied (layer thickness) and the nature of the substrate (layer support) depend on the desired field of application. The layer thickness range comprises in general values from about 0.1 μm to more than 10 μm.

After coating, the solvent is as a rule removed by drying, and the result is a layer of the composition according to the invention of the support.

The radiation-sensitive compositions according to the invention are suitable as photoresists for electronics (electroplating resist, etch resist, solder resist), for the production of printing plates such as offset printing plates or screen printing forms, for use in chemical milling or use as microresist in the production of integrated circuits. The possible layer supports and the processing conditions of the coated substrates are correspondingly diverse.

The use of the compositions according to the invention as a positive photoresist is a further subject of the invention.

Films of polyester, cellulose acetate or plastic-coated papers, for example, are used for photographic information recordings; specially treated aluminium is used for offset printing forms, copper laminates are used for the production of printed circuits, and silicon wafers are used for the production of integrated circuits. The layer thicknesses for photographic materials and offset printing forms are as a rule about 0.5 μm to 10 μm, and 0.4 to about 2 μm for printed circuits.

For producing relief structures, the substrate coated with the composition according to the invention is exposed imagewise. The term "imagewise" exposure comprises exposure through a photomask which contains a predetermined pattern, for example a transparency, exposure by a laser beam which is moved, for example under computer control, across the surface of the coated substrate and generates an image in this way, irradiation with computer-controlled electron beams and also irradiation with X-rays or UV light through an appropriate mask.

The radiation sources used can in principle be all lamps which emit radiation in the UV range. Both point light sources and two-dimensional emitters (lamp carpets) are suitable. Examples are: carbon arc lamps, xenon arc lamps, mercury vapour lamps doped, if appropriate, with metal halides (metal halide lamps), fluorescent lamps, incandescent argon lamps, electronic flash lamps, photographic floodlights, electron beams and X-rays. The distance between the lamp and the image material according to the invention can vary depending on the intended use and the type and/or intensity of the lamp, for example between 2 cm and 150 cm. Laser light sources, for example argon ion lasers or crypton ion lasers, are especially suitable. With laser light, the resist can also be exposed without a mask, the controlled laser beam writing directly on the resist layer. In this case, the high sensitivity of the materials according to the invention is very advantageous, since it allows high writing speeds at relatively low intensity. Printed circuits in the electronics industry, lithographic offset printing plates or relief printing plates as well as photographic image recording materials can be produced by this method. The high sensitivity of the resists is also of advantage for exposure by means of DUV steppers, since very short exposure times are desirable.

After the exposure, the resist is as a rule subjected to a heat treatment, the so-called post-exposure bake, in order to ensure complete reaction of the acid-sensitive groups in the polymer structure with the acid generated by the exposure. The duration and temperature of this post-exposure bake can vary within wide ranges and depend essentially on the composition of the acid-sensitive polymer and on the nature of the acid generator used as well as on the concentrations of these two components. Usually, the exposed resist is subjected for a period from a few seconds up to several minutes to temperatures of about 50°–150° C.

Surprisingly, the delay time, during which T-tops do not yet appear, is substantially extended in the case of the resists according to the invention, as compared with the hitherto known positive photoresist systems, for example those described in EP-A 366 590 or EP-A 342 498.

After the imagewise exposure and heat treatment of the material, carded out in the usual manner, the exposed areas of the photoresist are removed by dissolving them out in a developer.

The selection of the particular developer depends on the nature of the photoresist, in particular on the nature of the binder used or of the photolysis products formed. The developer can comprise aqueous solutions of bases, to which organic solvents or mixtures thereof have been added if necessary.

Particularly preferred developers are aqueous alkaline solutions, such as are also used for the development of naphthoquinone-diazide layers. These include in particular aqueous solutions of alkali metal silicates, phosphates, hydroxides and carbonates. If appropriate, minor quantities of wetting agents and/or organic solvents can also have been added to these solutions.

Typical organic solvents which can be added to the developer fluids are, for example, cyclohexanone, 2-ethoxyethanol, toluene, acetone, isopropanol, ethanol and mixtures of two or more of these solvents.

Apart from the greatly reduced delay time effects, the resist compositions according to the invention are distinguished by good application properties and high optical transparency, high thermal stability and very good resolution power (submicron region).

The protective layers and relief structures produced by using the photoresist compositions according to the invention represent a further subject of the invention.

EXAMPLES

1. Preparation of the Polymers

I.1. Terpolymer of 4-(2-tetrahydropyranyloxy)styrene, N-hydroxymethylmaleimide and N-acetoxymethylmaleimide In a 100 ml round-bottomed flask, 4.1 g (20 mmol) of 4-(2-tetrahydropyranyloxy)styrene, 1.3 g (10 mmol) of N-hydroxymethylmaleimide, 1.7 g (10 mmol) of N-acetoxymethylmaleimide and 0.3 g of dibenzoyl peroxide are dissolved in 30 ml of tetrahydrofuran (THF). The solution is stirred for 4 hours at 60° C. After cooling to room temperature, the polymer is precipitated in 1 l of methanol, filtered off and dried. This gives 6.2 g (87%) of a white powder which is characterized as follows:

$^1$H-NMR (CDCl$_3$, 300 MHz): $\delta$=6.3–7.4 ppm (m) $\delta$=5.1–5.6 ppm (s, broad) $\delta$=4.7–5.0 ppm (s, broad) $\delta$=3.8–4.0 ppm (s, broad) $\delta$=3.5–3.8 ppm (s, broad) $\delta$=1.2–2.3 ppm (m)

By means of gel permeation chromatography (GPC, polystyrene calibration), a molecular weight of $M_n$=13 950 (number average) and $M_w$=47 950 (weight average) is measured, from which a polymolecularity index PD=$M_w/M_n$ of 3.4 results. The thermogravimetric analysis (TGA, heating rate 10° C./min) shows a weight loss of 32% in the temperature range from 140° to 240° C.

I.2.–I.10. Terpolymers of 4-(2-tetrahydropyranyloxy)styrene, N-hydroxymethylmaleimide and N-acetoxymethylmaleimide Analogously to Example I.1., terpolymers are prepared with different monomer ratios. The quantities of the starting compounds employed and the yields and measured molecular weights are shown in Table 1 which follows.

TABLE 1

| | Terpolymers of 4-(2-tetrahydropyanyloxy)styrene, N-hydroxymethylmaleimide and N-acetoxymethylmaleimide | | | | | | | | |
|---|---|---|---|---|---|---|---|---|---|
| Example | I.2. | I.3. | I.4. | I.5. | I.6. | I.7. | I.8. | I.9 | I.10. |
| 4-(2-Tetra-hydropyranyloxy)styrene | 20.4 g (100 mmol) | 4.8 g (20 mmol) | 15.0 g (73 mmol) | 5.44 g (27 mmol) | 67.7 g (332 mmol) | 8.2 g (40 mmol) | 55.7 g (273 mmol) | 56.2 g (276 mmol) | 10.88 g (53 mmol) |
| N-Hydroxymethyl-maleimide | 88.9 g (70 mmol) | 1.78 g (14 mmol) | 4.7 g (37 mmol) | 2.03 g (16 mmol) | 16.9 g (132 mmol) | 2.03 g (16 mmol) | 12.1 g (95 mmol) | 7.38 g (58 mmol) | 2.71 g (21 mmol) |
| N-Acetoxymethyl-maleimide | 5.1 g (30 mmol) | 1.02 g (6 mmol) | 6.2 g (37 mmol) | 1.81 g (11 mmol) | 30.0 g (177 mmol) | 4.05 g (24 mmol) | 30.0 g (177 mmol) | 35.0 g (207 mmol) | 4.82 g (28.5 mmol) |
| Dibenzoyl peroxide | 1.5 g | 0.3 g | 1.0 g | 0.4 g | 4.97 g | 0.6 g | 3.9 g | 4.0 g | 0.8 g |
| THF | 150 ml | 30 ml | 100 ml | 40 ml | 500 ml | 60 ml | 420 ml | 400 ml | 80 ml |

TABLE 1-continued

| | Terpolymer of 4-(2-tetrahydropyranyloxy)styrene, N-hydroxymethylmaleimide and N-acetoxymethylmaleimide | | | | | | | | |
|---|---|---|---|---|---|---|---|---|---|
| Example | I.2. | I.3. | I.4. | I.5. | I.6. | I.7. | I.8. | I.9. | I.10. |
| Yield | 79% | 87% | 84% | 81% | 87% | 85% | 73% | 68% | 85% |
| $M_n$ | 5300 | 14,750 | 17,000 | 18,100 | 7420 | 10,400 | 7250 | 6300 | 16,050 |
| $M_w$ | 34,500 | 59,200 | 56,650 | 63,500 | 49,700 | 54,300 | 37,760 | 29,500 | 70,520 |
| PD | 6.5 | 4.0 | 3.3 | 3.5 | 6.7 | 5.2 | 5.2 | 4.7 | 4.4 |

I.11. Terpolymer of 4-(tert-butylcarbonyloxy)styrene, N-hydroxymethylmaleimide and N-acetoxymethylmaleimide In an 150 ml round-bottomed flask, 11.0 g (54 mmol) of 4-(tert-butylcarbonyloxy)styrene, 1.6 g (12.5 mmol) of N-hydroxymethylmaleimide, 6.3 g (37.5 mmol) of N-acetoxymethylmaleimide and 0.76 g of dibenzoyl peroxide are dissolved in 80 ml of THF. The solution is stirred for 4 hours at 60° C. After cooling to room temperture, the polymer is precipitated in 1 l of methanol, filtered off and then dissolved in 100 ml of THF. This solution is then slowly added to 1 l of a solvent mixture of n-hexane and toluene. The precipitate formed is filtered off and dried, giving 15.2 g (80%) of a white powder.

$^1$H-NMR (CDCl$_3$, 300 MHz): $\delta=6.2–7.5$ ppm (m) $\delta=5.3$ ppm (s, broad) $\delta=4.8$ ppm (s, broad) $\delta=2.4–3.5$ ppm (m) $\delta=2.0$ ppm (s) $\delta=1.5$ ppm (s)

GPC polystyrene calibration): $M_n=11,950$ $M_w=38,650$ PD$=3.2$

TGA (10° C./min): 27% weight loss in the range from 130°–180° C.

I.12. Terpolymer of 4-tert-butoxystyrene, N-hydroxymethylmaleimide and N-acetoxymethylmaleimide Analogously to Example I11., 13.9 g (83%) of a white powder are obtained from 8.8 g (50 mmol) of 4-tert-butoxystyrene, 1.6 g (12.5 mmol) of N-hydroxymethylmaleimide, 6.3 g (37.5 mmol) of N-acetoxymethylmaleimide and 0.67 g of dibenzoyl peroxide, dissolved in 80 ml of THF.

$^1$H-NMR (CDCl$_3$, 300 MHz): $\delta=6.2–7.3$ ppm (m) $\delta=5.3$ ppm (s, broad) $\delta=4.8$ ppm (s, broad) $\delta=2.4–3.6$ ppm (m) $\delta=2.0$ ppm (s) $\delta=1.3$ ppm (s)

GPC (polystyrene calibration): $M_n=18,980$ $M_w=65,150$ PD$=3.4$

TGA (10° C./min): 20% weight loss in the range from 280°–340° C.

I.13. Terpolymer of 4-(3-methylbut-2-enyloxy)styrene, N-hydroxymethylmaleimide and N-acetoxymethylmaleimide a) Synthesis of 4-(3-methylbut-2-enyloxy)styrene:

In a 500 ml three-necked flask with internal thermometer, nitrogen blanketing and a magnetic stirrer, 22 g (0.4 mol) of KOH powder in 200 ml of dimethyl sulfoxide are introduced. 12.0 g (0.1 mol) of p-hydroxystyrene are then added in portions at 20° C.; 30.0 g (0.2 mol) of 3,3'-dimethylallyl bromide are then added dropwise at 20° C. After stirring for 30 minutes at 20° C., 100 g of ice are added slowly. The mixture is then extracted twice with 200 ml of ether. The combined organic extracts are washed first with 200 ml of 1N sodium hydroxide solution and then with 200 ml of water and dried over MgSO$_4$. After removal of the solvent, the remaining residue is distilled in vacuo (0.07 mbar, 80° C.). This gives 15.5 g (82 mmol, 82%) of a colourless oil.

$^1$H-NMR (CDCl$_3$, 300 MHz): $\delta=7.31$ ppm (d, 2H) $\delta=6.85$ ppm (d, 2H) $\delta=6.63$ ppm (dd, 1H) $\delta=5.58$ ppm (dd, 1H) $\delta=5.47$ ppm (t, 1H) $\delta=5.09$ ppm (dd, 1H) $\delta=4.47$ ppm (d, 2H) $\delta=1.86$ ppm (s, 3H) $\delta=1.77$ ppm (s, 3H)

b) Synthesis of the terpolymer:

Analogously to Example I11., 14.73 g (85%) of a white powder are obtained from 9.4 g (50 mmol) of 4-(3-methylbut-2-enyloxy)styrene, 1.6 g (12.5 mmol) of N-hydroxymethylmaleimide, 6.3 g (37.5 mmol) of N-acetoxymethylmaleimide and 0.69 g of dibenzoyl peroxide, dissolved in 75 ml of THF.

$^1$H-NMR (CDCl$_3$, 300 MHz): $\delta=6.3–7.4$ ppm (m) $\delta=5.1–5.4$ ppm (m) $\delta=4.4$ ppm (s) $\delta=2.4–3.5$ ppm (m) $\delta=2.0$ ppm (s) $\delta=1.8$ ppm (s)

GPC (polystyrene calibration): $M_n=23,580$ $M_w=235,500$ PD$=9.9$

TGA (10° C./min): 14% weight loss in the range of 260°–320° C.

I.14. Terpolymer of 4-(2-tetrahydropyrranyloxy)styrene, N-hydroxymethylmaleimide and N-(2-acetoxyethyl)maleimide Analogously to Example I.1., 5.4 g (75%) of a white powder are obtained from 4.1 g (20 mmol) of 4-(2-(tetrahydropyranyloxy)styrene, 1.3 g (10 mmol) of N-hydroxymethylmaleimide, 1.8 g (10 mmol) of N-(2-acetoxyethyl)maleimide and 0.3 g of dibenzoyl peroxide, dissolved in 30 ml of THF.

$^1$H-NMR (CDCl$_3$, 300 MHz): $\delta=6.4–7.3$ ppm (m) $\delta=5.35$ ppm (s) $\delta=4.8$ ppm (s) $\delta=3.9$ ppm (m) $\delta=3.6$ ppm (m) $\delta=1.3–3.0$ ppm (m)

GPC (polystyrene calibration): $M_n=8150$ $M_w=59,100$ PD$=7.2$

TGA (10° C./min): 29% weight loss in the range of 180°–230° C. I.15. Terpolymer of 4-(2-tetrahydropyranyloxy)styrene, N-hydroxymethylmaleimide and N-(2-methoxyethyl)maleimide Analogously to Example I.1., 5.2 g (75%) of a white powder are obtained from 4.1 g (20 mmol) of 4-(2-tetrahydropyranyloxy)styrene, 1.3 g (10 mmol) of N-hydroxymethylmaleimide, 1.55 g (10 mmol) of N-(2-methoxyethyl)maleimide and 0.3 g of dibenzoyl peroxide, dissolved in 30 ml of THF.

$^1$H-NMR (CDCl$_3$, 300 MHz): $\delta=6.4–7.3$ ppm (m) $\delta=5.4$ ppm (s) $\delta=4.8$ ppm (s) $\delta=3.9$ ppm (m) $\delta=3.5$ ppm (m) $\delta=3.2$ ppm (m) $\delta=1.3–2.9$ ppm (m)

GPC (polystyrene calibration): $M_n=6660$ $M_w=54,800$ PD$=8.2$

TGA (10° C./min): 30% weight loss in the range of 150°–240° C.

I.16. Terpolymer of 4-(2-tetrahydropyranyloxy)benzyl methacrylate, N-hydroxymethylmaleimide and N-(acetoxymethyl)maleimide Analogously to Example I.1., 9.3 g (28%) of a white powder are obtained from 21.8 g (79 mmol) of 4-(2-tetrahydropyranyloxy)benzyl methacrylate, 6.3 g (49 mmol) of N-hydroxymethylmaleimide, 5.0 g (30 mmol) of N-(acetoxymethyl)maleimide and 1.0 g of dibenzoyl peroxide, dissolved in 130 ml of THF.

$^1$H-NMR (CDCl$_3$, 300 MHz): $\delta=6.7–7.4$ ppm (m) $\delta=5.4$ ppm (s) $\delta=4.9$ ppm (s) $\delta=3.8$ ppm (m) $\delta=3.6$ ppm (m) $\delta=0.8–3.0$ ppm (m)

GPC (polystyrene calibration): $M_n = 4270$ $M_w = 13{,}030$ PD=3.0

TGA (10° C./min): 27% weight loss in the range of 150°–300° C.

I.17. Terpolymer of 4-(2-tetrahydropyranyloxy)styrene, N-Hydroxymethylmaleimide and N-(acetoxymethyl)-maleimide Analogously to Example I.1., 7.5 g (80%) of a white powder are obtained from 5.1 g (25 mmol) of 4-(2-tetrahydropyranyloxy)styrene, 0.48 g (4 mmol) of N-hydroxymethylmaleimide, 3.59 g (21 mmol) of N-(acetoxymethyl)maleimide, 0.18 g of dodecanethiol and 0.18 g of bis-azoisobutyronitrile, dissolved in 64 ml of diglyme.

GPC (polystyrene calibration): $M_n = 9700$ $M_w = 20{,}700$ PD=2.1

II. Application Examples

II.1. Positive photoresist 2 g of the polymer from Example I14 and 0.1 g of triphenylsulfonium trifluoromethanesulfonate are dissolved in 7 g of cyclopentanone. The solution is filtered and spin-coated at 3000 rpm onto a quartz wafer (3 inches). The coated quartz wafer is then dried for 2 minutes at 120° C. The layer thickness of the film thus obtained is 1 μm. The coated wafer is then exposed imagewise (contact exposure) through a quartz mask with monochromatic radiation of wavelength 254 nm( 10 nm half-width) at a dosage of 30 mJ/cm². After exposure, the wafer is subjected on a hotplate for 2 minutes to a temperature of 120° C. and then developed in a 2.38% aqueous tetramethylammonium hydroxide solution, the exposed zones being dissolved out. Structures of 0.5 μm with approximately vertical wall profiles are perfectly resolved without formation of T-topping effects.

II.2. Positive photoresist 1.92 g of the polymer from Example I.17 and 0.08 g of triphenylsulfonium trifluoromethanesulfonate are dissolved in 8.0 ml of methoxypropyl acetate. The solution is filtered through a filter of 0.5 mm pore size and then spin-coated onto a silicon wafer (4 inches), an 850 nm thick resist film resulting after drying at 100° C. for 60 seconds. The coated wafer is then exposed imagewise with radiation of wavelength 248 nm by means of a Canon Excimer Laser Stepper (NA: 0.37) at a dosage of 18 mJ/cm². After exposure, the wafer is subjected on a hotplate for 1 minute to a temperature of 110° C. and then developed in a 0.262N aqueous tetramethylammonium hydroxide solution, the exposed zones being dissolved out. In this case, lines/spaces structures of 0.3 μm are resolved with approximately vertical wall profiles, without a residue.

In a second experiment carried out analogously, the heat treatment at 110° C. for 1 minute is not carded out until after waiting for one hour after the exposure. In this case too, lines/spaces structures of 0.3 μm are cleanly resolved, without detectable formation of T-topping effects.

II.3. Positive photoresist 1.92 g of the polymer from Example I.11. and 0.07 g of triphenylsulfonium trifluoromethanesulfonate are dissolved in 18.7 g of cyclopentanone. The solution is filtered through a Teflon filter of 0.2 μm pore size and then spin-coated onto a silicon wafer (100 mm). After heating on the hotplate (60 seconds, 130° C.), a 723 nm thick resist film is obtained. The exposure is carded out in optimum focus, using a 5:1 projection exposure apparatus (NA 0.37, Canon FPA 4500) at a wavelength of 248 nm in exposure steps of 1 mJ/cm². After heating on the hotplate (60 seconds, 120° C.), the exposed wafer is developed for 60 seconds in a 0.262N aqueous tetramethylammonium hydroxide solution. A positive image of the structuring mask is obtained. At an exposure dosage of 16 mJ/cm², sub-half micrometer structures are resolved with steep edges.

What is claimed is:

1. A radiation-sensitive composition comprising
   a) at least one polymer having a molecular weight (weight average) $M_w$ from $10^3$ to $10^6$, comprising recurring structural units of the formulae (I), (IIa) and (IIb)

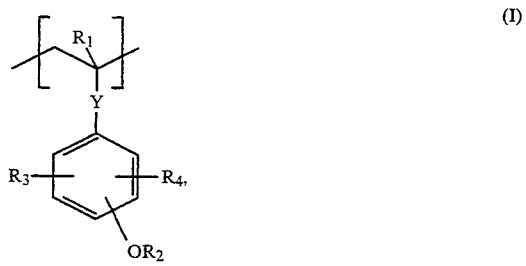

(I)

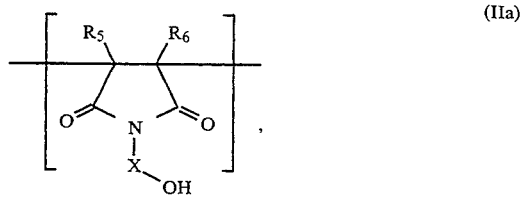

(IIa)

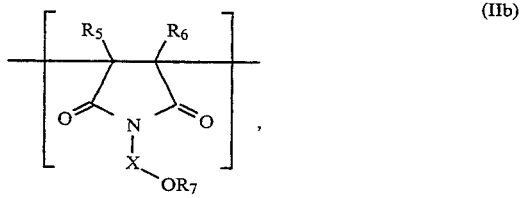

(IIb)

in which $R_1$ is hydrogen or methyl, Y is a direct bond or a divalent radical of tho formula

(III)

in which Z is a $C_1$–$C_6$alkylene group bound to the phenyl nucleus, $OR_2$ is an acid-cleavable radical, in which $R_2$ is $C_4$–$C_{10}$tert-alkyl, allyl, cyclohex-2-enyl, $C_6$–$C_{14}$aryl or $C_7$–$C_{16}$aralkyl which are unsubstituted or mono- or poly-substituted by $C_1$–$C_6$alkyl groups, $C_1$–$C_6$alkoxy groups or halogen atoms, trialkysilyl or a group of the formulae (IV)–(VII)

(IV)

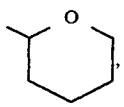

(V)

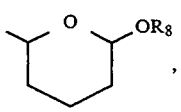

(VI)

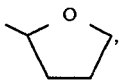

(VII)

in which $R_8$ is $C_1$-$C_6$alkyl, or $C_6C_{14}$aryl or $C_7$-$C_{16}$aralkyl which are unsubstituted or mono- or poly-substituted by $C_1$-$C_6$alkyl groups, $C_1$-$C_6$alkoxy groups or halogen atoms.

$R_3$ and $R_4$ independently of one another are hydrogen, $C_1$-$C_6$alkyl groups, $C_1$-$C_6$alkoxy groups or halogen atoms, $R_5$ and $R_6$ independently of one another are hydrogen or methyl, X is $C_1$-$C_6$alkylene and $R_7$ is $C_1$-$C_6$alkyl, or $C_6$-$C_{14}$aryl or $C_7$-$C_{16}$aralkyl which are unsubstituted or mono- or poly-substituted by $C_1$-$C_6$alkyl groups, $C_1$-$C_6$alkoxy groups or halogen atoms, or is —CO—$R_8$ in which $R_8$ is as defined in formula (IV), and b) at least one compound which generates an acid under the action of actinic radiation.

2. A composition according to claim 1, comprising a solvent or solvent mixture as a further component c).

3. A composition according to claim 1, comprising as component b) at least one compound of the formula (VIII)

$$(Ar_1)_q(Z_1)_r(Z_2)_s S^\ominus X_1^\oplus \qquad (VIII),$$

in which $Ar_1$ is phenyl, naphthyl or phenyl-$COCH_2$—, which are unsubstituted or substituted by halogen, $C_1$-$C_4$alkyl, $C_1$-$C_4$alkoxy, —OH and/or nitro, $Z_1$ is $C_1$-$C_6$alkyl or $C_3$-$C_7$cycloalkyl and $Z_2$ is tetrahydrothienyl, tetrahydrofuryl or hexahydropyryl, q is 0, 1, 2 or 3, r is 0, 1 or 2 and s is 0 or 1, the sum q+r+s being 3, and $X_1^\ominus$ is a chloride, bromide or iodide anion, $BF_4^\ominus$, $PF_6^\ominus$, $AsF_6^\ominus$, $SbF_6^\ominus$, $FSO^\ominus$ or the anion of an organic sulfonic acid or carboxylic acid.

4. A composition according to claim 3, in which $Ar_1$ is phenyl, q is the number 3, r and s are zero and $X_1^\ominus$ is $SbF_6^\ominus$, $AsF_6^\ominus$, $PF_6^\ominus$, $CF_3SO_3^\ominus$, $C_2F_5SO_3^\ominus$, n—$C_3F_7SO_3^\ominus$ n—$C_4F_9SO_3^\ominus$, n—$C_6F_{13}SO_3^\ominus$, n—$C_8F_{17}SO_3^\ominus$ or $C_6F_5SO_3^\ominus$.

5. A composition according to claim 3, in which the component b) is triphenylsulfonium trifluoromethanesulfonate.

6. A composition according to claim 1, comprising 0.1-20% by weight, preferably 1-10% by weight, of component b), relative to the weight of component a).

7. The protective layers and relief structures produced by using the composition according to claim 1.

* * * * *

UNITED STATES PATENT AND TRADEMARK OFFICE
CERTIFICATE OF CORRECTION

PATENT NO.  : 5,397,680
DATED       : March 14, 1995
INVENTOR(S) : ULRICH SCHÄDELI and NORBERT MÜNZEL It is certified that error appears in the above-indentified patent and that said Letters Patent is hereby corrected as shown below:

On the cover page item [73], correct the name of the second-listed assignee to read

"OCG MICROELECTRONICS".

Signed and Sealed this

Fourth Day of July, 1995

Attest:

BRUCE LEHMAN

Attesting Officer        Commissioner of Patents and Trademarks